(12) United States Patent
Rahman et al.

(10) Patent No.: US 6,812,869 B1
(45) Date of Patent: Nov. 2, 2004

(54) NOISE REDUCTION TECHNIQUES FOR PROGRAMMABLE INPUT/OUTPUT CIRCUITS

(75) Inventors: Arifur Rahman, Yonkers, NY (US); Harold Scholz, Allentown, PA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 10/367,323

(22) Filed: Feb. 13, 2003

(51) Int. Cl.[7] .............................................. H03M 7/00
(52) U.S. Cl. ...................................... 341/78; 327/211
(58) Field of Search ............................ 341/78; 326/83; 327/211

(56) References Cited

U.S. PATENT DOCUMENTS 6,320,441 B1 * 11/2001 Fletcher et al. ............. 327/211
6,339,343 B1 * 1/2002 Kim et al. ..................... 326/83

OTHER PUBLICATIONS

LVDS I/O Interface for Gb/s–per–Pin Operation in 0.35–$\mu$m CMOS, by Andrea Boni et al., IEEE Journal of Solid State Circuits, vol. 36, No. 4, Apr. 2001, pp. 706–711.

* cited by examiner

Primary Examiner—Brian Young
Assistant Examiner—Joseph Lauture
(74) Attorney, Agent, or Firm—MacPherson Kwok Chen & Heid LLP; Greg J. Michelson

(57) ABSTRACT

An input/output (I/O) circuit bank is disclosed, in accordance with one embodiment, having programmable I/O circuits configurable to support I/O interface standards for single-ended and differential signaling. The associated pads of one or more of the I/O circuits may be utilized to provide an external reference signal via a pass transistor onto an internal bus for use by the remainder of the I/O circuits. The pass transistors may be designed to function as lowpass filters to limit the amount of noise that passes through them.

21 Claims, 2 Drawing Sheets

NOISE REDUCTION TECHNIQUES FOR PROGRAMMABLE INPUT/OUTPUT CIRCUITS

TECHNICAL FIELD

The present invention relates generally to electrical circuits and, more particularly, to programmable input/output buffers along with design techniques and methodologies for noise reduction.

BACKGROUND

Input/output (I/O) circuits are commonly used for transferring data to and from an integrated circuit or other type of electronic device. I/O circuits (also referred to as input/output buffers, receiver/transmitter circuits, or receiver/driver circuits) are often designed to support a specific type of I/O interface standard (e.g., LVDS or HSTL) or one signal level requirement type within an I/O interface standard (e.g., a specific type of LVDS). These I/O interface standards generally address chip-to-chip interfaces, board-to-board interfaces, and box-to-box interfaces for a wide range of existing and emerging applications, such as data packet processing, data bus bridges, and high-speed memory interfacing.

Due to the growing proliferation of I/O interface standards (i.e., agreed principles of standards), it would be useful for an I/O circuit to have added flexibility, such as for example to support more than one I/O interface standard or more than one signal level requirement type within an I/O interface standard. However, providing this flexibility often leads to unwanted signal integrity issues, such as the introduction of an unacceptable level of noise. As a result, there is a need for noise reduction techniques for programmable input/output circuits.

SUMMARY

Systems and methods are disclosed herein for providing programmable input/output buffers and for reducing noise in programmable input/output buffers. For example, in accordance with an embodiment of the present invention, a programmable I/O buffer, which could be utilized for transmitting and receiving information, is utilized to channel (via its I/O pad) an external reference signal onto an internal reference bus. As another example, in accordance with an embodiment of the present invention, a design technique is presented to reduce the amount of noise injected through a programmable pass transistor associated with a programmable I/O buffer. By utilizing design techniques and methods discussed herein, flexible I/O circuits may be implemented having greater functionality and greater immunity to noise than conventional I/O circuits.

More specifically, in accordance with one embodiment of the present invention, an input/output circuit includes an input/output pad; an input buffer, coupled to the input/output pad, adapted to receive information from the input/output pad; an output buffer, coupled to the input/output pad, adapted to transmit information to the input/output pad; a reference bus adapted to programmably couple to the input buffer and the output buffer; and a transmission gate, coupled to the input/output pad and to the reference bus, adapted to selectively provide a signal path from the input/output pad to the reference bus for a reference signal.

In accordance with another embodiment of the present invention, an integrated circuit includes a plurality of input/output pads; a plurality of input/output buffers coupled to a corresponding first number of input/output pads from the plurality of input/output pads; and means for receiving a reference signal from one of the first number of input/output pads and selectively providing the reference signal to the plurality of input/output buffers corresponding to the remaining ones of the first number of input/output pads.

In accordance with another embodiment of the present invention, a method, for providing a reference signal in an input/output circuit bank, includes providing a plurality of input/output signal paths; associating a reference bus with the input/output signal paths; configuring one of the plurality of input/output signal paths to receive a reference signal and provide the reference signal to the reference bus, and coupling the reference bus to remaining ones of the plurality of input/output signal paths that require the reference signal.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

The preferred embodiments of the present invention and their advantages are best understood by referring to the detailed description that follows. It should be appreciated that like reference numerals are used to identify like elements illustrated in one or more of the figures.

DETAILED DESCRIPTION

Figure 1:
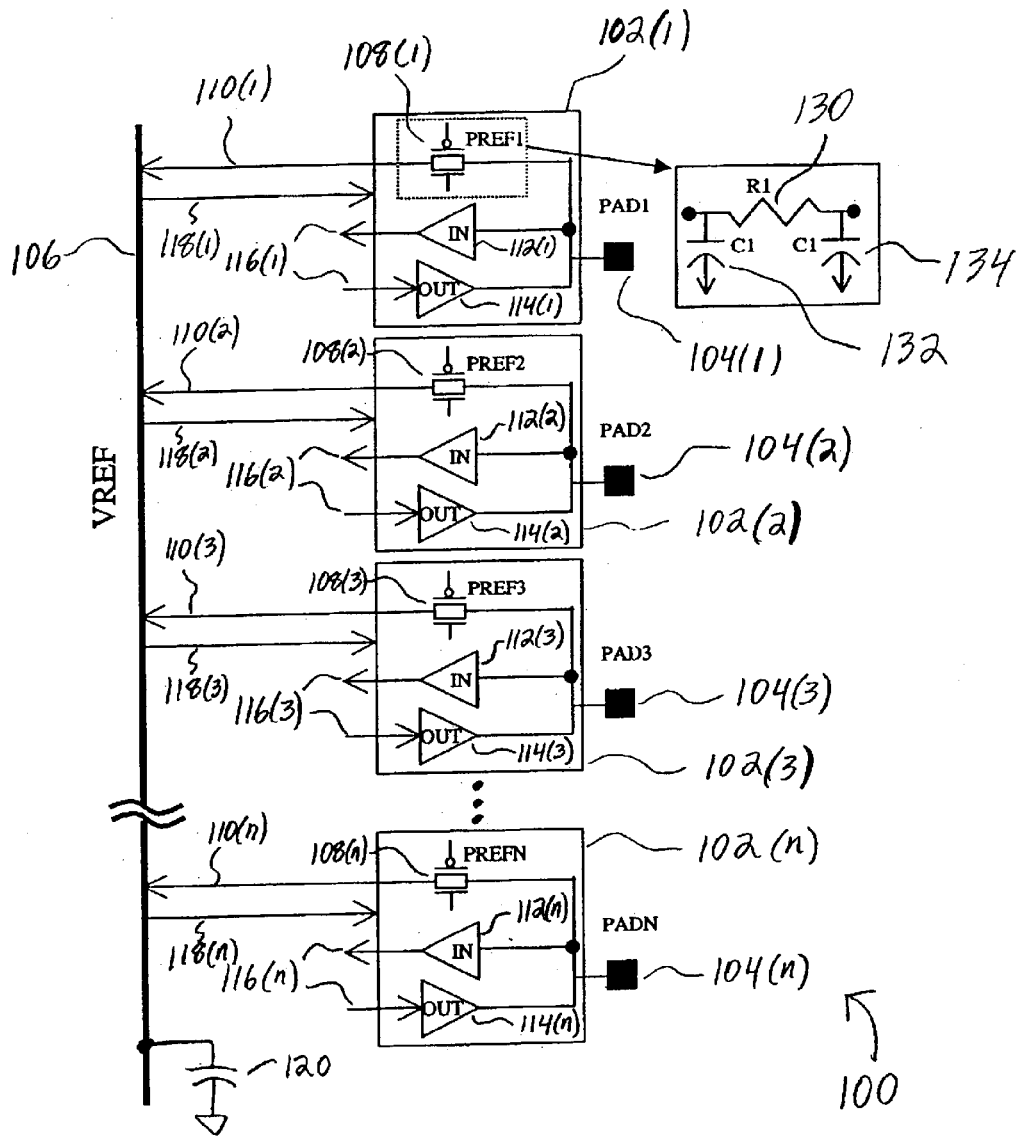
FIG. 1 shows a block diagram illustrating a bank of programmable input/output circuits in accordance with an embodiment of the present invention.

FIG. 1 shows a block diagram illustrating an input/output (I/O) circuit bank 100 in accordance with an embodiment of the present invention. I/O circuit bank 100 includes a plurality of I/O circuits 102, which are separately referenced as I/O circuits 102(1), 102(2), 102(3), ..., through 102(n), where "n" represents the number of I/O circuits 102 within I/O circuit bank 100. I/O circuit bank 100 is generally formed as part of an integrated circuit and functions to transfer information or signals into and/or out of the integrated circuit via corresponding pads 104 (i.e., pads 104(1), 104(2), 104(3), ... through 104(n), which may represent I/O pads, leads, terminals, or other I/O nodes) and corresponding signal paths 116 (i.e., signal paths 116(1), 116(2), 116(3), ..., 116(n)). For example, I/O circuit bank 100 may form a portion of the circuitry for a programmable logic device (e.g., a field programmable gate array (FPGA) or a complex programmable logic device (CPLD)).

I/O circuits 102 each include (as shown in FIG. 1) an input buffer 112 and an output buffer 114 (with corresponding numbering as described above for other elements). Input buffer 112 and output buffer 114 represent the circuits for transferring information (e.g., data and control signals) to and from the integrated circuit and may be designed to support various types of I/O interface standards, such as for example low voltage differential signaling (LVDS), current-mode logic (CML), high-speed transceiver logic (HSTL), stub series terminated logic (SSTL), and gunning transceiver logic (GTL), depending upon the requirements and anticipated integrated circuit application. Input buffers 112 and output buffers 114 may be designed to be configurable as single-ended buffers (e.g., for HSTL, SSTL, or GTL applications) and/or as differential buffers (e.g., for LVDS or CML applications), as described further herein.

Furthermore, each pair of input buffer 112 and output buffer 114 (e.g., input buffer 112(1) and output buffer 114(1) or input buffer 112(3) and output buffer 114(3)) may support the same type of I/O interface standard(s) or different I/O interface standard(s). For example, I/O circuit 102(1) may support an LVDS I/O interface standard while I/O circuit 102(2) may support an HSTL I/O interface standard. Consequently, each I/O circuit 102 (through its associated input buffer 112 and output buffer 114) may be designed to support one or more I/O interface standards or signal level requirements within an I/O interface standard, which may be the same or different than its neighboring I/O circuits 102.

I/O circuits 102 each may also include a corresponding programmable pass transistor (PPT) 108 (i.e., PPTs 108(1) through 108(n) and labeled PREF1 through PREFN, respectively), which couples corresponding pad 104 to a reference bus (labeled VREF) 106 via a corresponding lead 110 (i.e., 110(1) through 110(n)). PPT 108 (e.g., a transmission gate) provides for an external voltage reference signal to be programmably asserted onto reference bus 106. Thus, any one of I/O circuits 102 (e.g., I/O circuit 102(1)) can be used to provide an external reference signal to reference bus 106 (e.g., for use by I/O circuits 102(2) through 102(n) as required) and, therefore, the I/O circuit 102 employed to transfer the external reference signal would not also be utilized to support an I/O interface standard.

I/O circuits 102 may utilize the voltage reference signal on reference bus 106, if required by the I/O interface standard that I/O circuit 102 is supporting, by programmably coupling to reference bus 106 via a corresponding lead 118 (i.e., 118(1) through 118(n)). Leads 118 may programmably couple to corresponding I/O circuits 102 via programmable pass transistors, similar to PPTs 108, or by various other methods known in the art for coupling electrical circuitry. Thus, leads 118 programmably couple to I/O circuits 102 that require the voltage reference signal for proper operation (e.g., single ended buffers supporting voltage reference based I/O interface standards, such as HSTL, SSTL, or GTL).

For example, I/O circuit 102(1) may be utilized to route an external voltage reference signal, via pad 104(1), PPT 108(1), and lead 110(1), to reference bus 106. I/O circuit 102(2), which supports a voltage reference based I/O interface standard (e.g., HSTL) that requires the voltage reference signal for proper I/O operation, couples to reference bus 106 via lead 118(2) to receive the voltage reference signal. I/O circuits 102(3) through 102(n) may also couple to reference bus 106 via corresponding lead 118(3) through 118(n), if the voltage reference signal from reference bus 106 is required.

It should be understood that the design techniques and methodologies discussed herein (e.g., in reference to FIG. 1) may be further extended, such as to multiple I/O circuit banks and/or multiple reference buses per I/O circuit bank. For example, I/O circuit bank 100 may include one or more additional reference buses with additional corresponding PPTs within I/O circuits 102, such that pads 104 may be used to programmably couple (via the PPTs) voltage reference signals onto the selected reference buses.

For FIG. 1 for example, this may comprise reference bus 106 representing "m" buses, each one of leads 118 (e.g., lead 118(1)) representing "m" corresponding programmable leads, and each PPT 108 and lead 110 (e.g., PPT 108(1) and lead 110(1), respectively) representing "m" corresponding PPTs and "m" corresponding leads, respectively, where "m" represents the number of reference buses. Thus, I/O circuits 102 may programmably couple to the reference bus that provides the desired reference voltage for the I/O interface standard I/O circuits 102 are supporting.

Consequently, a number of external voltage reference signals may be programmably asserted onto respective reference buses within I/O circuit bank 100 via pads 104 and the PPTs, so that the external voltage reference signals are available for various I/O interface standards that are supported by I/O circuits 102 within I/O circuit bank 100. I/O circuits 102 may be programmably coupled to one of the reference buses via corresponding programmable leads 118 (i.e., multiple leads 118 for each I/O circuit 102 to programmably select a desired reference bus for each I/O circuit 102). Further details regarding multiple reference buses per I/O circuit bank and design techniques for selecting a desired reference bus for an I/O circuit is disclosed in U.S. patent application Ser. No. 10/366,956 entitled "Programmable Interface Circuit for Differential and Single-Ended Signals" and filed on February 13, 2003, which is incorporated herein by reference in its entirety.

Figure 2:
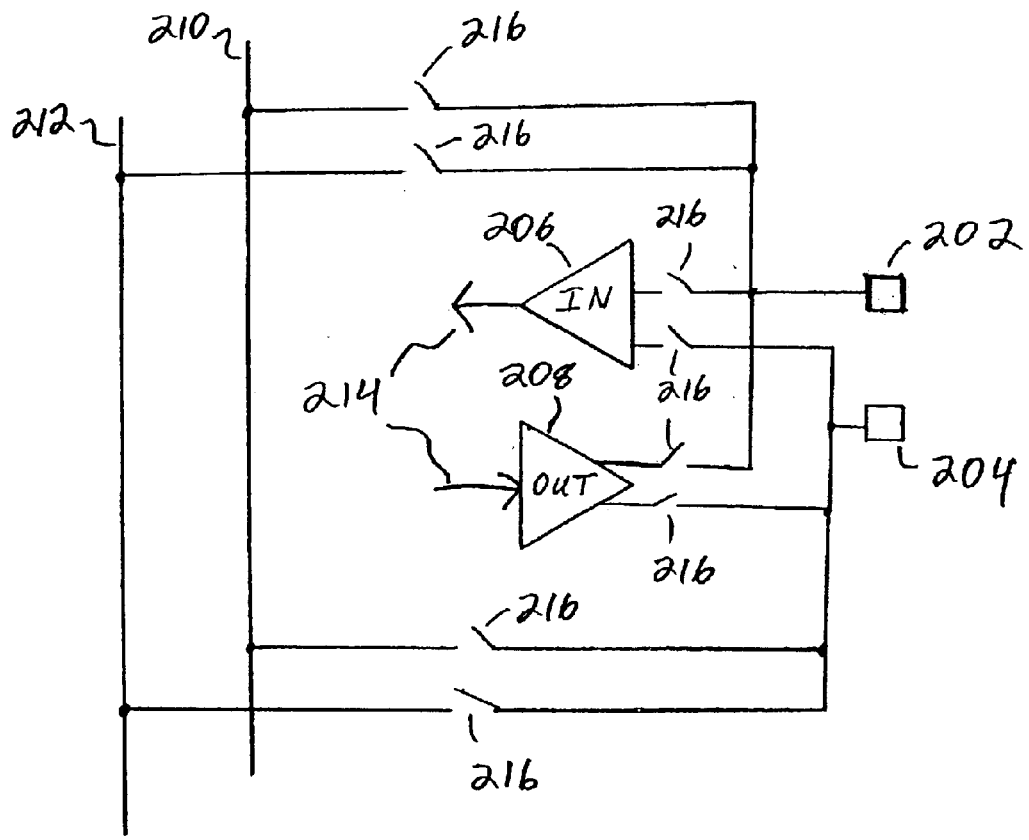
FIG. 2 shows an exemplary circuit diagram illustrating a programmable input/output circuit and two reference buses in accordance with an embodiment of the present invention.
Figure 1:
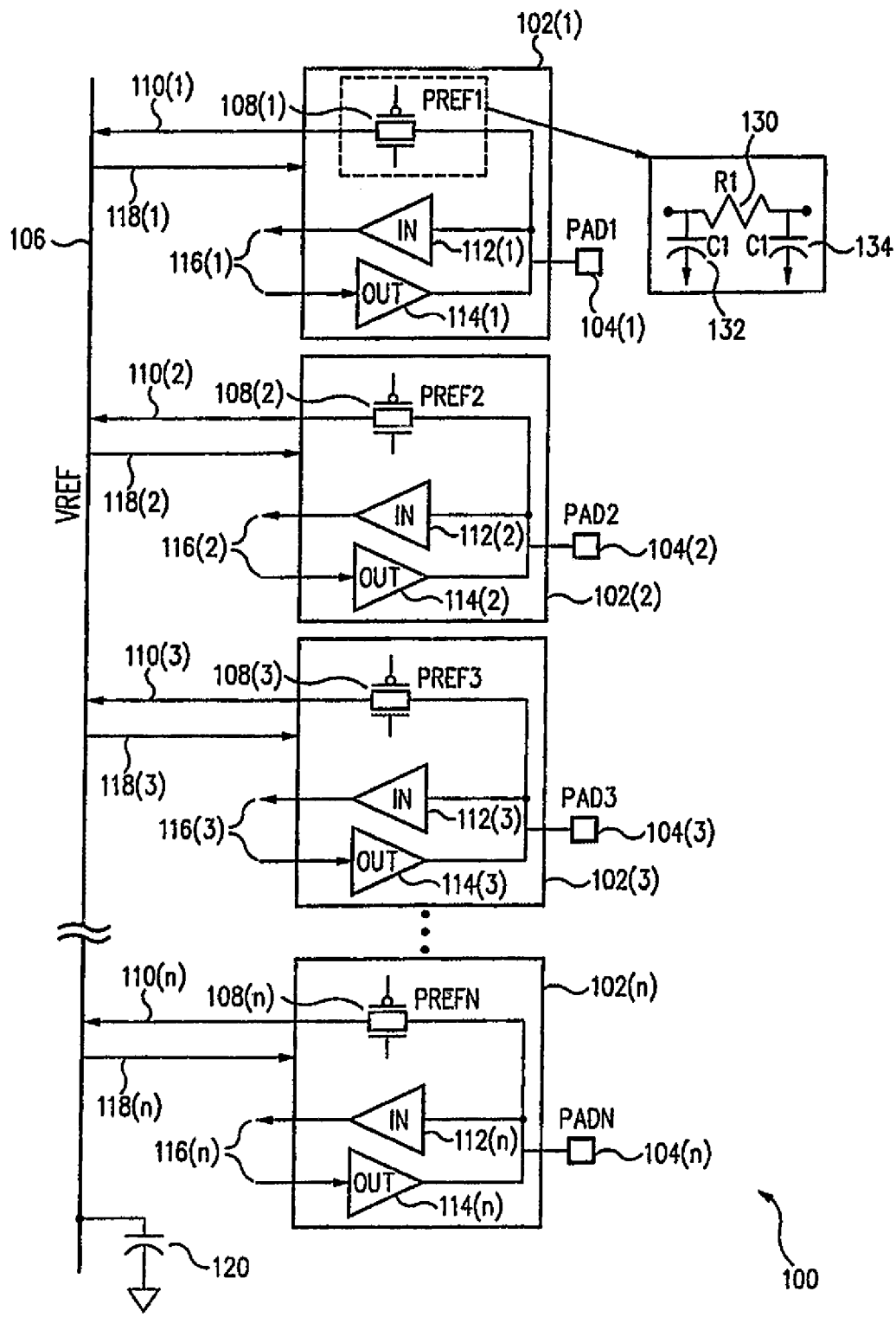
Figure 2:
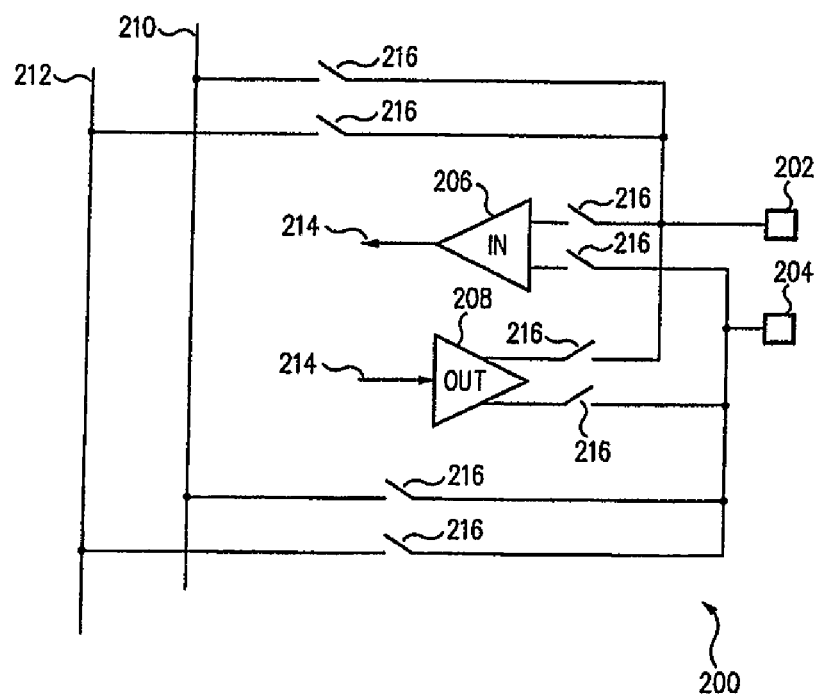
Figure 1:
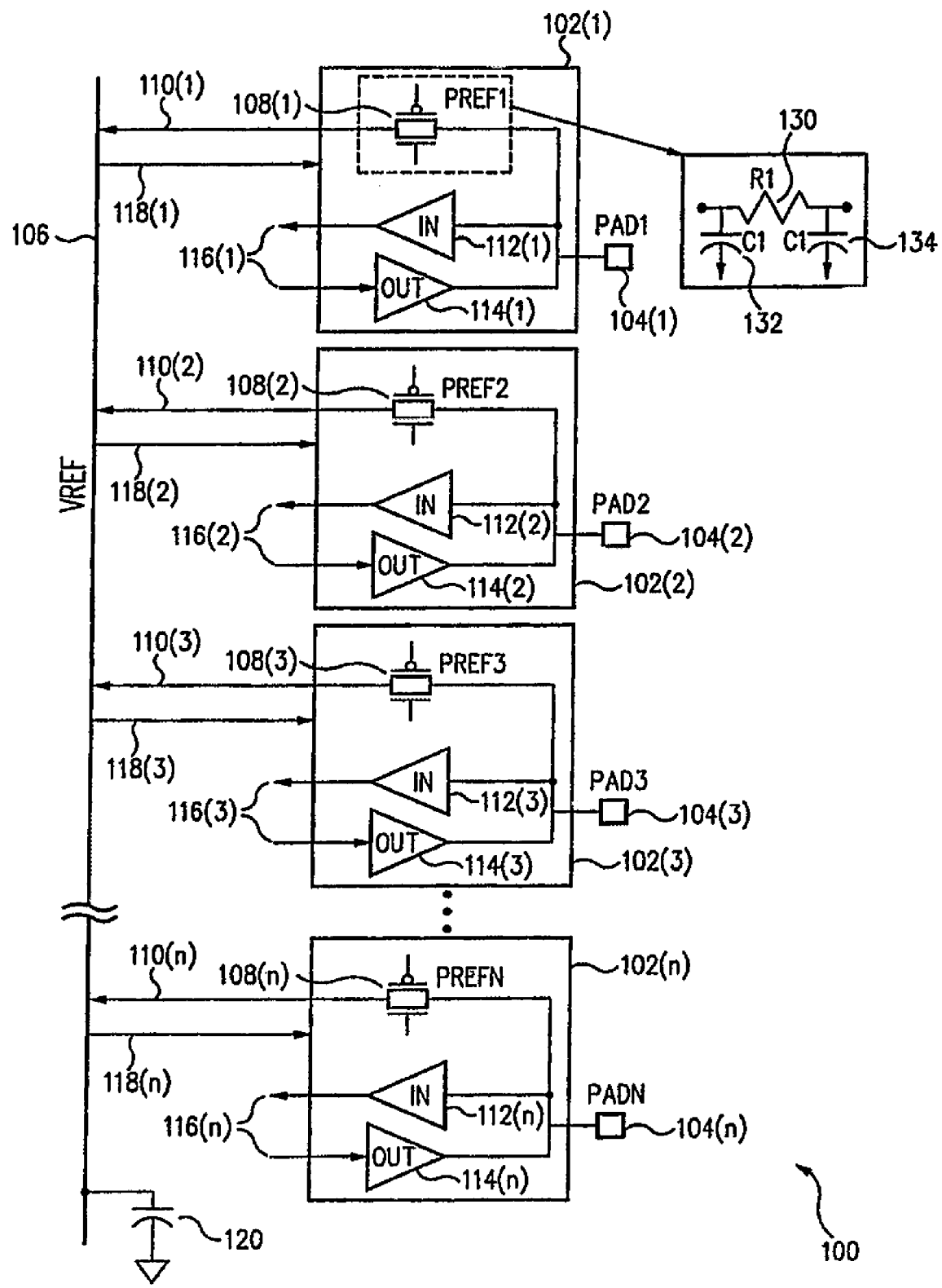
Figure 2:
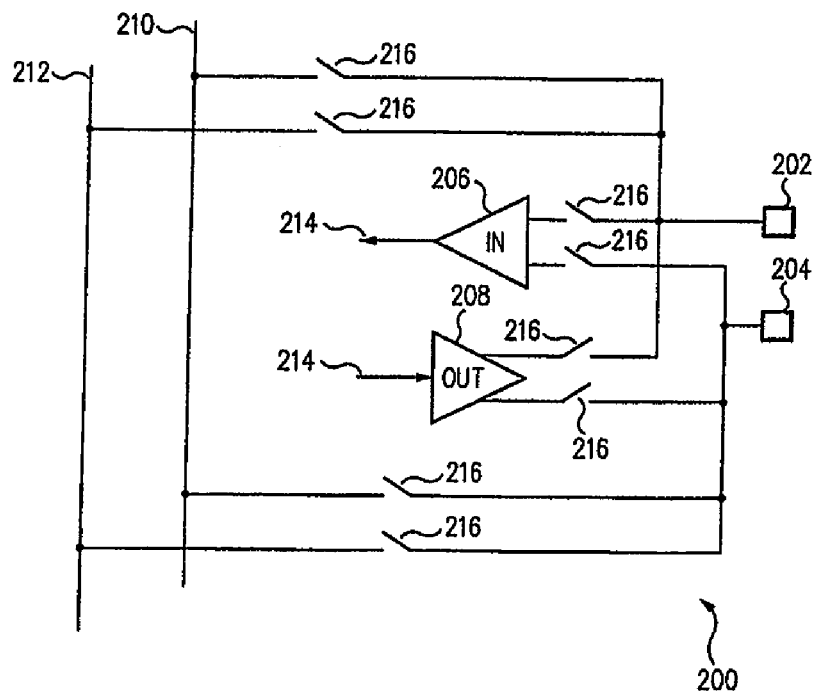

As an example of multiple reference buses, FIG. 2 shows an exemplary circuit diagram 200 illustrating a programmable input/output circuit and two reference buses, which forms part of an I/O circuit bank, in accordance with an embodiment of the present invention. Circuit diagram 200 includes pads 202 and 204, an input buffer 206, an output buffer 208, and reference buses 210 and 212. Pads 202 and/or 204 may be employed to assert one or two external reference voltages onto reference buses 210 and/or 212 via switches 216. For example, one external reference voltage (e.g., 0.7 V) may be asserted onto reference bus 210 via pad 202 and corresponding switch 216, while a second external reference voltage (e.g., 0.8 V) may be asserted onto reference bus 212 via pad 204 and corresponding switch 216.

Switches 216 represent programmable pass transistors, either a p-type transistor or an n-type transistor, or a combination of p-type and n-type transistors (e.g., PPT 108 as in FIG. 1, which however could also be replaced with a single transistor in accordance with another embodiment), such as in multiplexer transmission gates. Switches 216 and PPT 108 may be programmed or controlled by an appropriate control signal at its gate terminal(s). The control signal may be received from a memory cell (e.g., a static random access memory (SRAM) cell of a programmable logic device), which can be programmed to provide the desired signal level.

When pads 202 and 204 are utilized for conveying external reference voltages onto reference buses 210 and 212, input buffer 206 and output buffer 208 are not utilized. However, if other pads (not shown) associated with other I/O circuits within an associated I/O circuit bank (which include input buffer 206 and output buffer 208) are utilized to convey the external reference voltages onto reference buses 210 and 212, then input buffer 206 and output buffer 208 can be configured as single ended buffers or differential buffers (via corresponding switches 216) to transfer information via pads 202 and 204. Thus, with two reference buses accessible having different reference voltages, more than one type of voltage reference based I/O interface standard (e.g., HSTL and GTL) may be supported within the I/O circuit bank, along with differential based I/O interface standards.

Input buffer 206 and output buffer 208 (as well as input buffer 112 and output buffer 114) may be further programmable to support various common mode terminations and common mode voltage levels for differential signaling. Further details may be found, for example, in U.S. patent application Ser. No. 10/266,361 entitled "Low Voltage Differential Signaling Systems and Methods" filed Oct. 7, 2002 and U.S. patent application Ser. No. 10/283,765 entitled "Programmable Common Mode Termination for Input/Output Circuits" filed Oct. 30, 2002, which are incorporated herein by reference in their entirety.

Returning to FIG. 1, for the I/O circuits 102 that are not programmed to provide an external reference signal to reference bus 106, depending upon the voltage levels or signal levels on their corresponding pads 104, noise or other unwanted signal interference can be injected onto reference bus 106 through their corresponding PPTs 108. As an example, I/O circuit 102(n) is utilized to provide a direct current (DC) reference signal to reference bus 106 by switching on PPT 108(n). PPTs 108(1) through 108(n−1) are switched off (e.g., by being configured or programmed for this state) by applying a supply voltage (VDD) and a ground voltage (VSS) as gate voltages to a p-type transistor and an n-type transistor (e.g., field effect transistors), respectively, which form each of PPTs 108 (as shown in FIG. 1).

However, due to various factors (e.g., impedance mismatch or cross coupling), it is possible for the signal levels on one or more of pads 104(1) through 104((n−1)) to exceed the supply voltage (VDD) or fall below the ground voltage (VSS) applied to PPTs 108(1) through 108((n−1)) for generally very brief time periods (e.g., several nanoseconds). If the signal level exceeds the supply voltage (VDD), the p-type transistor within the associated PPT 108 (i.e., one of PPT 108(1) through 108((n−1)) corresponding to pad 104(1) through 104((n−1)) receiving the interfering signal) will begin to switch on. In a similar fashion, if the signal level falls below the ground voltage (VSS), the n-type transistor within the associated PPT 108 will begin to switch on. Therefore, depending on the signal level at pads 104, noise (e.g., any interfering signal) can be injected through one or more of PPTs 108 and onto reference bus 106.

For a worst case example, the total noise level (i.e., interfering signal level) on reference bus 106 will be the superposition of noise levels asserted on pads 104 and injected through corresponding PPTs 108 (i.e., PPTs 108(1) through 108((n−1)) for the example above). As a result, the intended DC signal on reference bus 106 may be very noisy and can lead to significantly higher bit error rates (BER) for I/O circuits 102 configured to support voltage reference based I/O interface standards (e.g., GTL, HSTL, SSTL, etc.) and utilizing the reference voltage signal on reference bus 106.

The noise injection through partially switched on PPTs 108 can be reduced by employing certain design techniques, in accordance with an embodiment of the present invention, to minimize unwanted signal interference or noise and help preserve signal integrity on reference bus 106 for I/O circuit bank 100. As an example (illustrated in FIG. 1), PPT 108(1) is represented by a resistor 130 and capacitors 132 and 134 (i.e., PPT 108(1) is modeled by an equivalent resistive capacitive (RC) network).

In the switched off state, the resistance of resistor 130 depends on the signal level on the associated pad 104 (i.e., pad 104(1) for PPT 108(1)). By appropriate selection of transistor size (i.e., a width (W) and a length (L)) for the p-type transistor and the n-type transistor that forms each PPT 108, any desired off-state resistance (e.g., 1000 MΩ) and capacitance (e.g., 10 to 100 fF) for these transistors (that are in a weak or marginally switched "on" state) can be obtained.

Thus, by the appropriate selection of resistance and capacitance values for resistor 130 and capacitors 132 and 134, respectively, PPT 108 can function as a lowpass filter (to block the high frequency interfering signals) when in a marginally witched on state (i.e., programmed to be switched off but noise on associated pad 104 results in a marginally switched on state, as described above). Additionally, one or more capacitors (e.g., on-chip capacitors), such as a capacitor 120, may optionally be coupled to reference bus 106 to provide additional signal integrity for signals on reference bus 106.

More specifically for one example, time constants associated with the rise/fall time of the injected noise voltage may be roughly proportional to the resistance and the junction capacitance of the partially switched on p-type transistor or n-type transistor of PPT 108 (e.g., PPT 108(1)). By increasing the resistance of the partially switched on transistor (i.e., by reducing its size), the rise and/or fall time of the injected noise voltage is decreased and its impact minimized. The resistance may be increased, for example, by reducing the width/length ratio of the transistors. However, it is also desirable to maintain a high junction capacitance, which is roughly proportional to the width of the transistors. Thus, by reducing the size of the partially switched on transistor to transistor dimensions of, for example, a channel width (W) of 2 μm and a channel length (L) of 2 μm, for the n-type transistor (i.e., $W_n=L_n=2$ μm) and the p-type transistor (i.e., $W_p=L_p=2$ μm), the injected noise can be minimized to acceptable levels.

Based on this example and assuming there are 30 of pads 104 that are injecting noise (e.g., due to overshoot and undershoot of voltage supply levels of 1 V above and below the supply voltage (VDD) and the ground voltage (VSS), respectively) onto reference bus 106, simulated results indicate that the maximum noise voltage on reference bus 106 may fall within 5 to 10 mV when 30 I/O circuits 102 (e.g., LVCMOS or TTL type buffers) are switching simultaneously within I/O circuit bank 100. The injected noise may be filtered out further by having an additional lowpass filter between pads 104 and reference bus 106 or by employing capacitors, such as optional capacitor 120.

As discussed herein, programmable I/O circuits are disclosed that can support various signaling levels and types, while minimizing signal integrity issues. The programmable I/O circuits can be configured as single-ended buffers (e.g., for I/O interface standards such as HSTL, SSTL, or GTL) or as differential buffers (e.g., for I/O interface standards such as LVDS or CML) or utilized to provide a reference signal (e.g., direct current voltage reference) to a reference bus via a pass transistor. The pass transistor may be designed to provide a filtering function and limit the amount of noise able to pass through the pass transistor and onto the reference bus.

Embodiments described above illustrate but do not limit the invention. It should also be understood that numerous modifications and variations are possible in accordance with the principles of the present invention. Accordingly, the scope of the invention is defined only by the following claims.

We claim:

1. An input/output circuit comprising:
    an input/output pad;
    an input buffer, coupled to the input/output pad, adapted to receive information from the input/output pad;
    an output buffer, coupled to the input/output pad, adapted to transmit information to the input/output pad;
    a reference bus adapted to programmably couple to the input buffer and the output buffer; and
    a transmission gate, coupled to the input/output pad and to the reference bus, adapted to selectively provide a signal path from the input/output pad to the reference bus for a reference signal.

2. The circuit of claim 1, wherein the input buffer and the output buffer are configurable for single-ended signals or differential signals.

3. The circuit of claim 2, wherein the input buffer and the output buffer programmably couple to the reference bus when configured for the single-ended signals.

4. The circuit of claim 3, wherein the input buffer and the output buffer support LVDS, CML, HSTL, SSTL, or GTL input/output interface standards.

5. The circuit of claim 1, wherein the transmission gate is adapted to minimize transmission of noise.

6. The circuit of claim 5, wherein a size of the transmission gate is reduced to increase its resistance.

7. The circuit of claim 6, wherein an equivalent resistance and capacitance of the transmission gate is designed to provide lowpass filtering.

8. The circuit of claim 5, wherein a channel width and a channel length of the transmission gate is approximately 2 $\mu$m.

9. The circuit of claim 1, wherein the input/output circuit forms a portion of an input/output circuit bank within a programmable logic device.

10. The circuit of claim 1, further comprising a capacitor coupled to the reference bus.

11. The circuit of claim 1, further comprising:
    a second reference bus adapted to programmably couple to the input buffer and the output buffer; and
    a second transmission gate, coupled to the input/output pad and to the second reference bus, adapted to selectively provide a second signal path from the input/output pad to the second reference bus for a second reference signal.

12. An integrated circuit comprising:
    a plurality of input/output pads;
    a plurality of input/output buffers coupled to a corresponding first number of input/output pads from the plurality of input/output pads; and
    means for receiving a reference signal from one of the first number of input/output pads and selectively providing the reference signal to the plurality of input/output buffers corresponding to the remaining ones of the first number of input/output pads.

13. The integrated circuit of claim 12, wherein the plurality of input/output buffers are configurable for single-ended signals or differential signals.

14. The integrated circuit of claim 12, wherein the means for receiving a reference signal comprises a programmable pass transistor and a reference bus.

15. The integrated circuit of claim 12, means for receiving a reference signal is adapted to minimize transmission of noise by providing lowpass filtering.

16. The integrated circuit of claim 12, wherein the plurality of input/output buffers forms an input/output circuit bank within a programmable logic device.

17. The integrated circuit of claim 12, further comprising means for receiving a second reference signal from one of the first number of input/output pads and selectively providing the second reference signal to the plurality of input/output buffers corresponding to the remaining ones of the first number of input/output pads.

18. A method for providing a reference signal in an input/output circuit bank, the method comprising:
    providing a plurality of input/output signal paths;
    associating a reference bus with the input/output signal paths;
    configuring one of the plurality of input/output signal paths to receive a reference signal and provide the reference signal to the reference bus; and
    coupling the reference bus to remaining ones of the plurality of input/output signal paths that require the reference signal.

19. The method of claim 18, wherein the input/output signal paths support single-ended signals or differential signals.

20. The method of claim 18, wherein the configuring further comprises filtering the reference signal to minimize interfering signals.

21. The method of claim 18, further comprising:
    associating a second reference bus with the input/output signal paths;
    configuring another one of the plurality of input/output signal paths to receive a second reference signal and provide the second reference signal to the second reference bus; and
    coupling the second reference bus to remaining ones of the plurality of input/output signal paths that require the second reference signal.

* * * * *

UNITED STATES PATENT AND TRADEMARK OFFICE
CERTIFICATE OF CORRECTION

PATENT NO. : 6,812,869 B1
APPLICATION NO. :10/367323
DATED : November 2, 2004
INVENTOR(S) : Rahman et al.

It is certified that error appears in the above-identified patent and that said Letters Patent is hereby corrected as shown below:

In the drawings, replace Sheet 1 of 2 and Sheet 2 of 2 with the attached drawing sheets.

Signed and Sealed this

Fourth Day of September, 2007

JON W. DUDAS
*Director of the United States Patent and Trademark Office*

UNITED STATES PATENT AND TRADEMARK OFFICE
CERTIFICATE OF CORRECTION

PATENT NO. : 6,812,869 B1
APPLICATION NO. :10/367323
DATED : November 2, 2004
INVENTOR(S) : Rahman et al.

It is certified that error appears in the above-identified patent and that said Letters Patent is hereby corrected as shown below:

Delete the title page and substitute therefor the attached title page.

In the drawings, replace Sheet 1 of 2 and Sheet 2 of 2 with the attached drawing sheets.

This certificate supersedes Certificate of Correction issued September 4, 2007.

Signed and Sealed this

Twenty-third Day of October, 2007

JON W. DUDAS
*Director of the United States Patent and Trademark Office*

(12) United States Patent
Rahman et al.

(10) Patent No.: US 6,812,869 B1
(45) Date of Patent: Nov. 2, 2004

(54) NOISE REDUCTION TECHNIQUES FOR PROGRAMMABLE INPUT/OUTPUT CIRCUITS

(75) Inventors: Arifur Rahman, Yonkers, NY (US); Harold Scholz, Allentown, PA (US)

(73) Assignee: Lattice Semiconductor Corporation, Hillsboro, OR (US)

(*) Notice: Subject to any disclaimer, the term of this patent is extended or adjusted under 35 U.S.C. 154(b) by 0 days.

(21) Appl. No.: 10/367,323

(22) Filed: Feb. 13, 2003

(51) Int. Cl.7 .................................... H03M 7/00
(52) U.S. Cl. .............................. 341/78; 327/211
(58) Field of Search ..................... 341/78; 326/83; 327/211

(56) References Cited

U.S. PATENT DOCUMENTS 6,320,441 B1 * 11/2001 Fletcher et al. ............. 327/211
6,339,343 B1 * 1/2002 Kim et al. .................. 326/83

OTHER PUBLICATIONS

LVDS I/O Interface for Gb/s-per-Pin Operation in 0.35-μm CMOS, by Andrea Boni et al., IEEE Journal of Solid State Circuits, vol. 36, No. 4, Apr. 2001, pp. 706–711.

* cited by examiner

Primary Examiner—Brian Young
Assistant Examiner—Joseph Lauture
(74) Attorney, Agent, or Firm—MacPherson Kwok Chen & Heid LLP; Greg J. Michelson

(57) ABSTRACT

An input/output (I/O) circuit bank is disclosed, in accordance with one embodiment, having programmable I/O circuits configurable to support I/O interface standards for single-ended and differential signaling. The associated pads of one or more of the I/O circuits may be utilized to provide an external reference signal via a pass transistor onto an internal bus for use by the remainder of the I/O circuits. The pass transistors may be designed to function as lowpass filters to limit the amount of noise that passes through them.

21 Claims, 2 Drawing Sheets

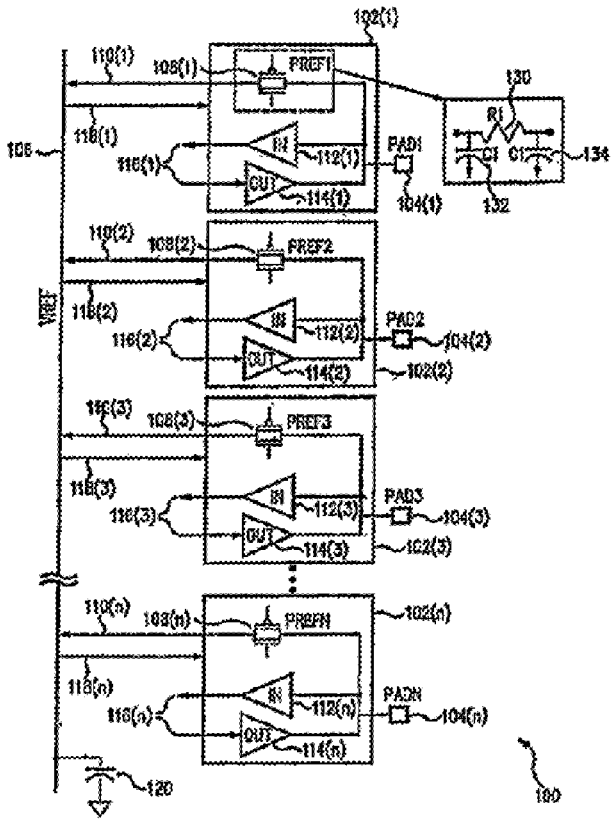

UNITED STATES PATENT AND TRADEMARK OFFICE
CERTIFICATE OF CORRECTION

PATENT NO. : 6,812,869 B1
APPLICATION NO. : 10/367323
DATED : November 2, 2004
INVENTOR(S) : Rahman et al.

It is certified that error appears in the above-identified patent and that said Letters Patent is hereby corrected as shown below:

In Col. 8, line 12, of Claim 15, after "claim 12," insert : --wherein the--

Signed and Sealed this

Twenty-seventh Day of January, 2009

JOHN DOLL
*Acting Director of the United States Patent and Trademark Office*